(12) United States Patent
Gotkis et al.

(10) Patent No.: US 6,653,224 B1
(45) Date of Patent: Nov. 25, 2003

(54) METHODS FOR FABRICATING INTERCONNECT STRUCTURES HAVING LOW K DIELECTRIC PROPERTIES

(75) Inventors: Yehiel Gotkis, Fremont, CA (US); Rodney Kistler, Los Gatos, CA (US); Leonid Romm, Fremont, CA (US); Te Hua Lin, Los Gatos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/032,480

(22) Filed: Dec. 27, 2001

(51) Int. Cl.$^7$ ............................................. H01L 21/4763

(52) U.S. Cl. ........................ 438/627; 438/629; 438/633

(58) Field of Search ................................ 438/626, 627, 438/629, 633, 634

(56) References Cited

U.S. PATENT DOCUMENTS

| | | | |
|---|---|---|---|
| 6,184,128 B1 | * | 2/2001 | Wang et al. ................ 438/637 |
| 6,207,570 B1 | * | 3/2001 | Much .......................... 438/692 |
| 6,265,307 B1 | * | 7/2001 | Lou ............................. 438/633 |

* cited by examiner

*Primary Examiner*—T. N. Quach
(74) *Attorney, Agent, or Firm*—Martine & Penilla, LLP

(57) ABSTRACT

Methods for fabricating semiconductor structures having LowK dielectric properties are provided. In one example, a copper dual damascene structure is fabricated in a LowK dielectric insulator including forming a capping film over the insulator before features are defined therein. After the copper is formed in the features, the copper overburden is removed using ultra-gentle CMP, and then the barrier is removed using a dry etch process. Following barrier removal, a second etch is performed to thin the capping film. The thinning is configured to reduce the thickness of the capping film without removal, and thereby reducing the K-value of the LowK dielectric structure.

19 Claims, 7 Drawing Sheets

METHODS FOR FABRICATING INTERCONNECT STRUCTURES HAVING LOW K DIELECTRIC PROPERTIES

BACKGROUND OF THE INVENTION

1. Field of the Invention

The present invention relates generally to the fabrication of semiconductor structures, and more specifically to the fabrication of copper, LowK dielectric, dual damascene structures.

2. Description of the Related Art

In the fabrication of semiconductor devices, integrated circuits are defined on semiconductor wafers by forming a plurality of layers over one another resulting in multi-level structures. As a result of the various layers disposed over one another, a surface topography of the wafer can become irregular, and an un-corrected irregularity increases with the number of subsequent layers deposited. Chemical Mechanical Planarization (CMP) has developed as a fabrication operation primarily utilized to planarize the surface topography of deposited layers, and to remove the overburden deposits. Additional fabrication operations including surface finish, buffing, insulator cleaning, etching, and the like, are also frequently accomplished using CMP processes and apparatus.

At the substrate level, transistor devices having diffusion regions are formed over and into silicon substrates. In subsequent levels, interconnect metallization lines are patterned and electrically connected to the transistor devices to define a desired functional device. As is well known, patterned conductive layers are insulated from other conductive layers by dielectric materials, such as silicon dioxide in conventional cases. At each metallization level there is a need to remove the overburden metal or to planarize dielectric material. Without planarization, fabrication of additional metallization layers becomes substantially more difficult due to the higher variations in the surface topography. In other major applications, metallization line patterns are formed in the dielectric material, then conductive material is deposited over the whole wafer surface, and finally, metal a CMP operation is performed to remove excess metallization, e.g., such as copper. An additional diffusion layer is normally deposited prior to conductor deposition to prevent diffusion of conductive material into the bulk of dielectric that deteriorates its insulating dielectric properties and poisons the transistors.

Copper dual damascene technology, and the technology of conductive material dual damascene structures, evolved into a process of choice for the integrated circuit industry. In copper dual damascene fabrication, the Cu-CMP is typically utilized for both copper and barrier overburden removal, as described below in references to FIGS. 1A–1C.

FIG. 1A shows a portion of a semiconductor wafer 10 with a typical copper dual damascene structure being fabricated therein. Features 14 such as trenches and vias have been fabricated into insulator 12. A barrier 18 has been deposited over the insulator 12 lining the features 14. Copper fill has been deposited in the features 14 resulting in copper overburden 16 over barrier 18.

FIG. 1B shows the portion of semiconductor wafer 10 with the copper dual damascene structure being fabricated therein described in FIG. 1A after a first CMP process has been performed. The first CMP is performed to planarize the surface of the insulator 12 at the barrier 18. The copper overburden 16 shown in FIG. 1A is essentially removed, leaving only copper fill 16' in features 14, and barrier 18 to make up the planarized surface. It should be appreciated that, up until the point of removal of the copper overburden (see FIG. 1A) exposing barrier 18, the surface being planarized by CMP is a homogenous material. As soon as barrier 18 is exposed, the surface becomes heterogeneous with both copper fill 16' and barrier 18 material and chemical properties being processed by CMP.

FIG. 1C shows an ideal completion of a dual damascene structure fabricated in a portion of a semiconductor wafer 10. The ideal structure illustrated is the fabrication goal following a second CMP of the structure illustrated in FIG. 1B. Barrier 18 (see FIG. 1B) is removed leaving a planarized insulator surface including the insulator 12, a barrier liner 18' of features 14, and the copper fill 16' within features 14. It should be noted that number of materials with differing material and chemical properties processed by CMP in FIG. 1C is now three.

As is known, CMP was initially developed for, and is most effective and well suited for planarization of a non-planar homogenous (i.e., consisting of the same material) surface. Looking again at FIG. 1B, it should be appreciated that in final phases of the copper CMP, the surface is neither homogenous, nor is it in need of planarization. In typical copper dual damascene structure fabrication, CMP is the next process step to be performed on the structure, but it is not a structure well suited for CMP.

To planarize a surface, CMP implements a combination of chemical and abrasive action by applying a surface to be planarized against a processing surface having varying degrees of elasticity, varying degrees of abrasiveness, wetted with varying degrees of chemically aggressive slurry which also may contain varying degrees of abrasiveness, all according to process goals, process conditions, material and chemical properties, and the like. In the case of copper CMP, it is common practice to use a processing surface such as a pad with a high degree of hardness. Due to the typically hard insulator 12 underlying a copper dual damascene structure, pressure is generally also moderate to high, and the frictional contact generated between the processing surface and the surface to be planarized, results in generally high shear stress at the surface of the wafer.

Under the processing conditions just described, the point at which the copper overburden 16 (see FIG. 1) is removed and barrier 18 is exposed, the surface being processed by CMP is practically flat, however no longer homogenous, and the effectiveness of the CMP is dramatically reduced. Typically, it is at this point when the CMP process, and processing conditions are modified in order to remove barrier 18 with a second CMP process, but the heterogeneous surface including the hard barrier 18 and the soft copper 16' are not optimally processed by the same CMP operation. Instead of the ideal structure illustrated in FIG. 1C, a typical semiconductor wafer is processed less precisely and results in less than ideal structures therein.

FIG. 1D illustrates a typical copper dual damascene structure reflecting structural flaws typical of heterogeneous CMP processing. CMP generally removes barrier 18 (see FIG. 1B) and leaves features 14 lined with barrier liner 18' and copper filled 16', but surface irregularities are noted such as dishing 20 in the copper fill 16', and a less than planar surface 22 across the structure. The less than planar surface 22 typically also includes dielectric erosion 24. Additionally, because copper is a material of the structure, and it is a soft and reasonably chemically reactive material, preventing corrosion of the copper fill 16', and scratching, are also serious fabrication challenges.

What is needed are methods and apparatus for copper, and other conductive material, dual damascene structure fabrication that exploit the advantages of CMP for planarization of the homogenous part of the overburden material, which is copper, and implement alternative fabrication processes better suited for heterogeneous surface processing. The methods and apparatus should be implemented to maximize manufacturing efficiency, and position the technology of dual damascene to better introduce and develop emerging related technologies.

SUMMARY OF THE INVENTION

Broadly speaking, the present invention fills these needs by providing a method for forming dual damascene structures in LowK dielectric insulators that utilizes CMP for those processes in which CMP is most effective, and etch for those processes better suited for etch fabrication. Additionally, methods of the present invention exploit emerging technologies for fabricating LowK and ultra-LowK dielectric structures. The present invention can be implemented in numerous ways, including as a process, an apparatus, a system, a device, or a method. Several embodiments of the present invention are described below.

In one embodiment, a method for fabricating semiconductor structures on a insulator is disclosed. The method includes forming a LowK dielectric material over the insulator, and forming a capping film over the LowK dielectric material. Features are formed in the LowK dielectric material which have inner surfaces defined by the LowK dielectric material. The features define regions for receiving a conductive material. A barrier layer is formed over the capping film and over the surfaces of the features, and the features are filled with the conductive material. The filling of the features leaves an overburden amount of the conductive material. The method further includes performing a chemical mechanical planarization (CMP) operation to remove the overburden amount of the conductive material. The CMP operation is configured to be discontinued upon reaching at least part of the barrier layer. The method then performs a dry etch to remove the barrier layer. The dry etch is configured to expose at least part of the capping film. In another embodiment, a method for fabricating semiconductor structures on a insulator is disclosed. The method includes forming a LowK dielectric material over the insulator and then forming a capping film over the LowK dielectric material. The capping film is defined by at least two contiguously formed material layers. The method next forms features in the LowK dielectric material which have inner surfaces defined by the LowK dielectric material. The features define regions for receiving a conductive material. The method further includes forming a barrier layer over the capping film and over the surfaces of the features. The features are filled with the conductive material which leaves an overburden amount of the conductive material. Next, the method performs a chemical mechanical planarization (CMP) operation to remove the overburden amount of the conductive material. The CMP operation is configured to be discontinued upon reaching at least part of the barrier layer. The method continues by performing a first dry etch to remove the barrier layer to expose at least part of the capping film; and then performing a second dry etch to remove at least one of the contiguously formed material layers of the capping film.

In still a further embodiment, a method for removing a portion of overburden conductive material, barrier film and capping film in a semiconductor structure is disclosed. The semiconductor structure has a LowK dielectric material, which has features defined therein for forming conductive vias and conductive vias and trenches. Further, a top surface of the LowK dielectric material has a capping film, and a barrier film lines the features and is formed over the capping film. A conductive material fills the features and leaves a portion of overburden conductive material over the barrier film. The method includes first performing a chemical mechanical planarization (CMP) operation to remove the portion of overburden conductive material, and discontinuing the CMP operation when the portion of overburden conductive material is determined to be substantially removed. Next, the method includes moving the semiconductor structure to a plasma etching station and performing an initial plasma etch to remove the barrier film. The method then performs a follow-up plasma etch to remove at least part of the capping film. The method then includes determining if a next LowK dielectric layer is required. If the next LowK dielectric layer is required, a next LowK dielectric layer is formed and the method repeated.

The advantages of the present invention are numerous. One notable benefit and advantage of the invention is that CMP is exploited for fabrication operations well suited for CMP, and etch is utilized for those operations better suited for etch. The resulting structure is more precisely fabricated and with less scrap and defects.

Another benefit is the methods of the present invention accommodate the emerging technologies of ultra-LowK dielectrics, and are therefore capable of implementation as new materials and structures are introduced.

Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

Figure 1A:
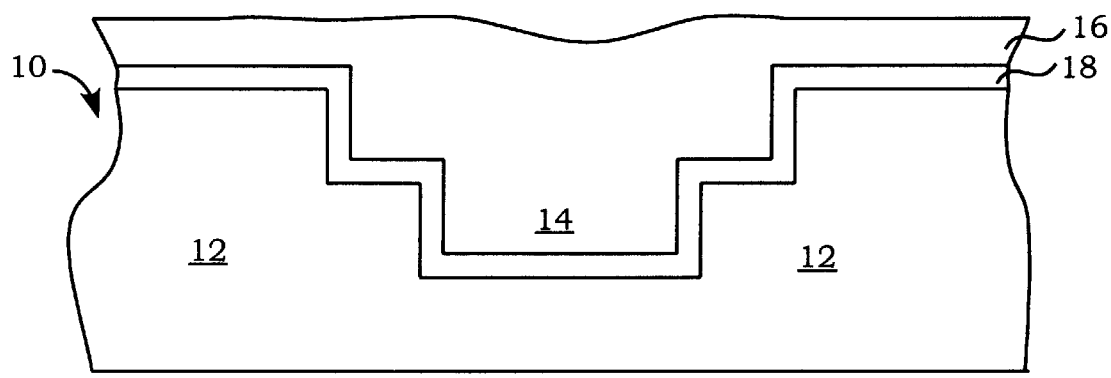
FIG. 1A shows a portion of a semiconductor wafer with a typical copper dual damascene structure being fabricated therein.
Figure 1B:
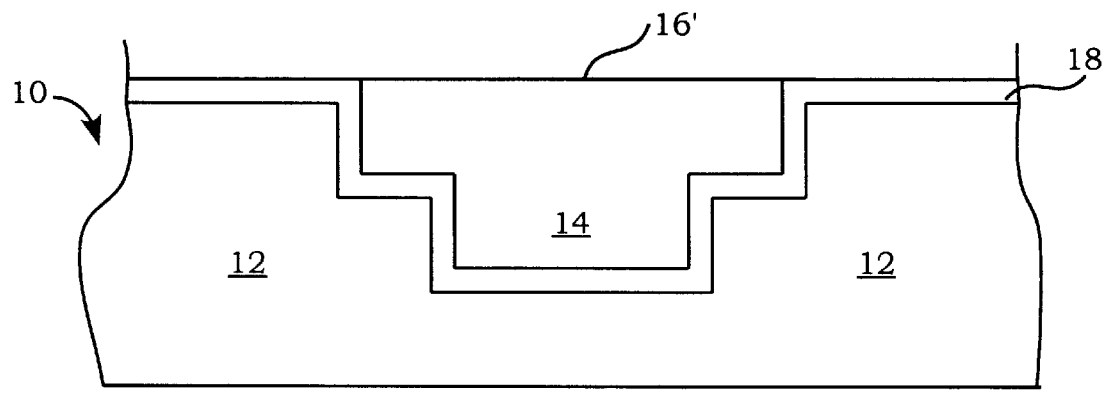
FIG. 1B shows the portion of semiconductor wafer with the copper dual damascene structure being fabricated therein described in FIG. 1A after a first CMP process has been performed.
Figure 1C:
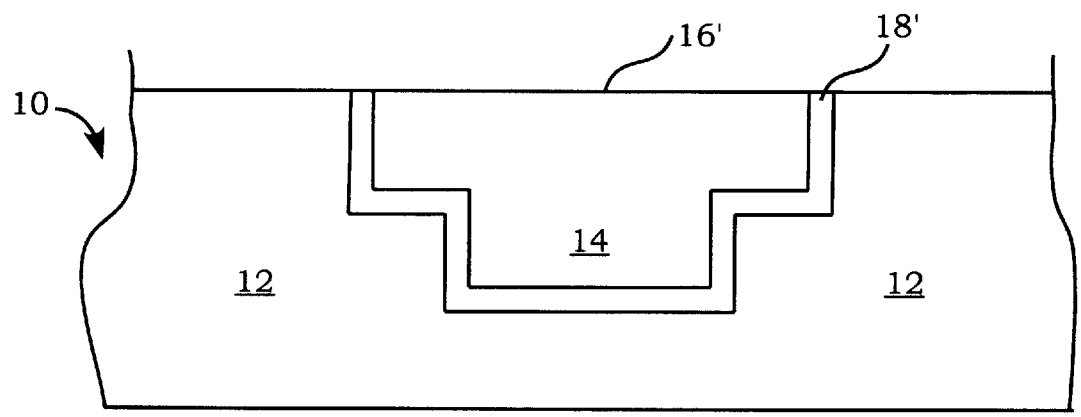
FIG. 1C shows an ideal completion of a dual damascene structure fabricated in a portion of a semiconductor wafer.
Figure 1D:
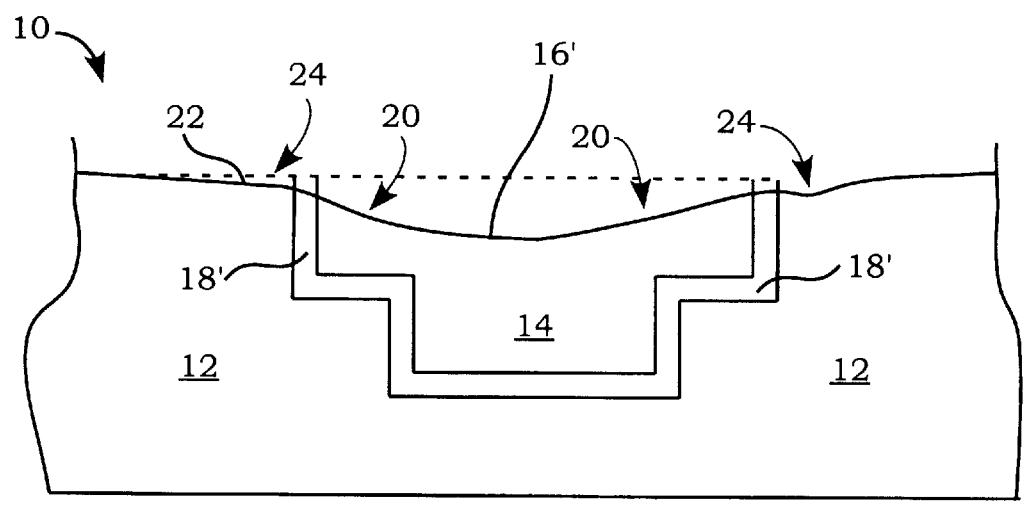
FIG. 1D illustrates a typical dual damascene structure reflecting structural flaws typical of heterogeneous CMP processing.

An invention for methods of fabricating dielectric structures having LowK dielectric properties is disclosed. In preferred embodiments, methods include fabrication of copper dual damascene structures in LowK dielectric insulators using ultra-gentle CMP for copper overburden removal and a first etch for barrier removal. A second etch is then performed if needed to thin a capping film, and accomplish an additional lowering of the K-value of the LowK structure.

performing a dry etch to remove the barrier layer, the dry etch being configured to expose at least part of the capping film.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Copper dual damascene structures are frequently fabricated in a LowK dielectric insulator to form copper LowK dual damascene structures. While copper has emerged as a preferred conductive material for the general structure, technological advances in LowK dielectrics are resulting in fundamental structural changes in the LowK dielectric insulators. These fundamental structural changes are necessitating new approaches to fabrication processes used to form copper LowK dual damascene structures. Further, copper is used in a preferred embodiment of the present invention due to its preferred implementation in semiconductor structures, but it should be recognized that the present invention is not limited to the use of copper as a conductive material. Rather, copper is used herein as an illustrative embodiment, but the methods and structures described are applicable to generally any conductive material, and by way of example, Tungsten and Aluminum are just two more of a plurality of conductive materials used in LowK dielectric dual damascene structures.

One of the fundamental structural changes in the LowK dielectric insulator is the migration to porous and highly porous dielectric materials. The resulting structure will represent significant advancement over prior art structures, but will also necessitate manufacture and process modification. The typical fabrication processes of a first CMP to remove the copper overburden, and a second CMP to remove the barrier and planarize the surface, already flawed as described above, will require modification and re-engineering to achieve the desired result.

In the fabrication of copper LowK dual damascene structures, as well as copper ultra-LowK dual damascene structures, a generally two-tiered approach will be described. The first tier will include the removal of copper overburden, and the second tier will include the removal of the barrier. In one embodiment, additional structure fabrication processes are described that are performed after the removal of the barrier, but are closely associated with barrier removal.

Figure 2A:
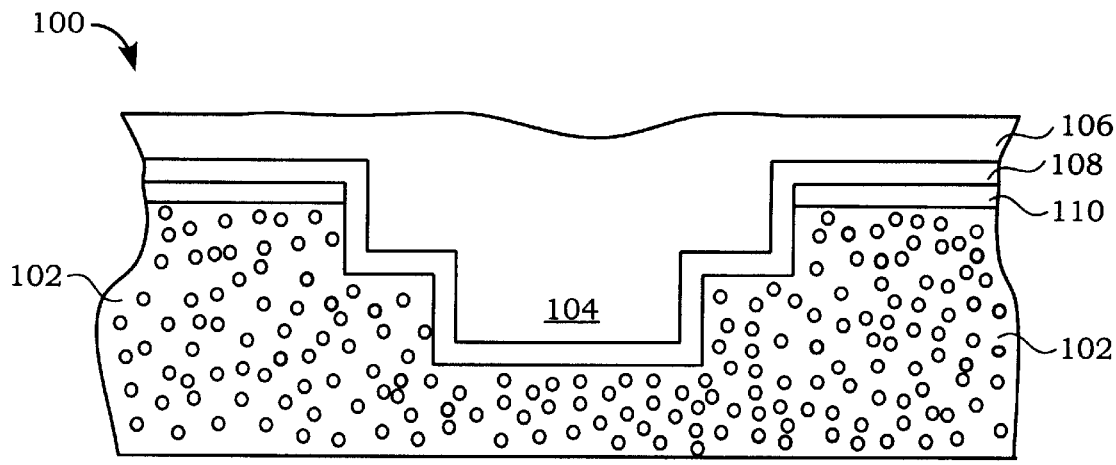
FIG. 2A shows a copper LowK dual damascene structure being fabricated in a porous LowK dielectric insulator in accordance with one embodiment of the present invention.

FIG. 2A shows a copper LowK dual damascene structure 100 being fabricated in a porous LowK dielectric insulator 102 in accordance with one embodiment of the present invention. As used herein, the term "LowK dielectric" is used universally for dielectric structures that can be designated as both "LowK dielectric" and "ultra-LowK dielectric." The K-values achieving designation as one of LowK or ultra-LowK, as well as the specific materials and associated processes utilized to achieve the K-values are beyond the scope of the present invention. Therefore, the general term of LowK dielectric is used and should be understood to include a range of dielectrics from those designated as LowK through those designated as ultra-LowK.

As illustrated in FIG. 2A, a capping film 110 is deposited over a porous LowK dielectric insulator 102. Features 104, such as trenches and vias, are then formed in the porous LowK dielectric insulator 102, and then a barrier 108 is deposited which lines the features 104, and forms a layer over capping film 110. Copper fill is then deposited in the features 104 over barrier 108 forming copper overburden 106. As will be described in greater detail below in reference to FIGS. 3A and 3B, capping film 110, in one embodiment, serves to protect porous LowK dielectric insulator 102 during structure fabrication, and serves as an etch stop for barrier 108 removal. In one embodiment, barrier 108, in copper dual damascene fabrication, is typically fabricated from one of Tantalum and Tantalum Nitride.

The copper LowK dual damascene structure 100 illustrated in FIG. 2A is next processed to remove copper overburden 106. Additionally, the surface of the copper LowK dual damascene structure 100 needs to be planarized for optimum subsequent structure fabrication processes. CMP remains the process of choice for copper overburden 106 removal and surface planarization. Unlike CMP in prior art copper dual damascene applications, one embodiment of the present invention implements an ultra-gentle CMP process for copper overburden 106 removal.

As described above in reference to FIGS. 1A through 1D, prior art copper CMP is typically performed with a process surface having a high degree of hardness, and under high pressure. This results in high pressure imparted on the dielectric insulator, and high shear stress at the surface layers of the structure being fabricated. In prior art structures, the relative hardness of the dielectric insulator, e.g., quartz, silicon, silicon dioxide, and the like, adequately withstands the high pressure. High shear stress, however, even in structures with hard dielectric insulators, can cause such structural failures as peeling at the barrier/dielectric junction.

In one embodiment of the present invention, the copper LowK dual damascene structure 100 illustrated in FIG. 2A is processed using ultra-gentle CMP. High pressures imparted in prior art copper dual damascene CMP could cause structural failure of the porous LowK dielectric insulator 102, and shear stress could cause separation at the capping film 110. Ultra-gentle CMP effectively removes the copper overburden 106, and planarizes the structure surface at the barrier 108. In accordance with one embodiment of the invention, ultra-gentle CMP uses a hard-skin processing surface over a flexible or compliant pad, belt, roller, or other processing core or tool. This provides a hard surface, but with give. In one embodiment, the processing surface is a processing pad implemented in a sub-aperture CMP processing system. In another embodiment, the processing surface is a CMP belt implemented in a linear belt-drive CMP processing system. In still a further embodiment, the processing surface is one or more rollers configured in a roller-type CMP processing system.

In addition to a hard-skin processing surface over a flexible pad, belt, roller, or other processing core or tool, ultra-gentle CMP is implemented with little or no abrasive added to slurry. In one embodiment, any required abrasiveness is supplied by the processing surface. In another embodiment, soft abrasives are included in the processing slurry. In one embodiment, soft abrasives are added to slurries for processing of structures with sufficient capping film 110 to protect the porous LowK dielectric insulator 102 from any additional pressure resulting from the addition of soft abrasives, and from any increase in shear stress resulting from the addition of soft abrasives.

In one embodiment, the copper removal using ultra-gentle CMP is facilitated by use of inhibitor-assisted direct charge transfer chemistry. In one embodiment, the direct charge transfer chemistry used is $Cu^0+Fe^{3+}\rightarrow Cu^{2+}+Fe^{2+}$ to remove and planarize the copper overburden 106. In one embodiment, organic large molecule inhibitors are utilized to enhance planarization. An inhibitor is also used to prevent surface oxide film formation.

Figure 2B:
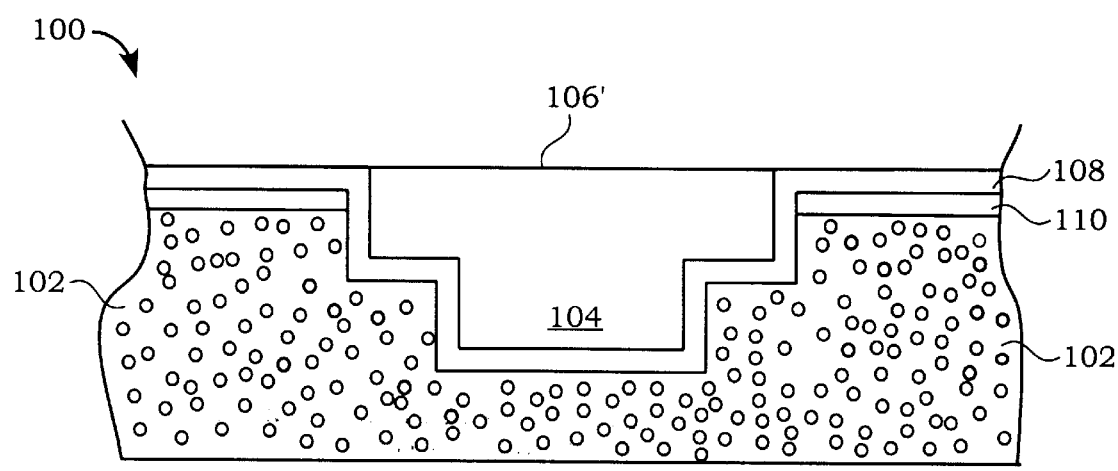
FIG. 2B shows the copper LowK dual damascene structure of FIG. 2A at the completion of ultra-gentle CMP in accordance with one embodiment of the invention.

In one embodiment of the invention, the ultra-gentle CMP is utilized to remove copper overburden 106, and planarize the surface of the copper LowK dual damascene structure 100 at the upper level of barrier 108. FIG. 2B shows the copper LowK dual damascene structure 100 of FIG. 2A at the completion of ultra-gentle CMP in accordance with one embodiment of the invention. Features 104 are copper filled 106' and lined by barrier 108. The surface of the structure 100 is now heterogeneous and includes the copper fill 106' and barrier 108. At the surface, barrier 108 is immediately over capping film 110, which is over porous LowK dielectric insulator 102. The next fabrication process is to remove barrier 108 at the surface of the structure.

As described above in reference to FIGS. 1A through 1D, prior art structure fabrication includes a second CMP process to remove barrier 108. Typically, in copper dual damascene-structures, barrier 108 is a Tantalum or Tantalum Nitride material, which is generally resilient. Additionally, Tantalum tends to form volatile fluorides in combination with or in the presence of effective CMP chemicals. Although barrier 108 is typically only 200 Å–300 Å in thickness, CMP of barrier 108 is particularly challenging due to chemical and mechanical resilience, and barrier 108 being only part of a heterogeneous surface that includes soft copper. CMP is therefore a less than ideal process choice.

Figure 3A:
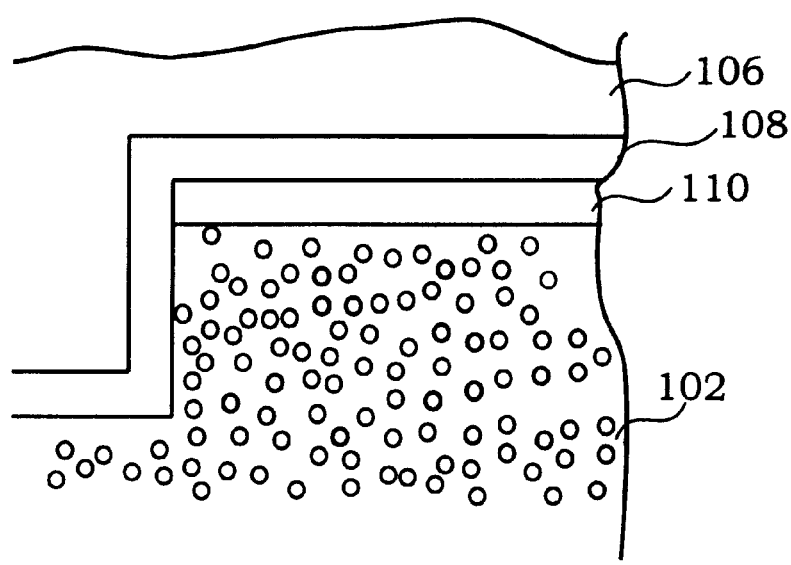
FIG. 3A shows a closer view of a section of copper LowK dual damascene structure shown in FIGS. 2A through 2C in accordance with one embodiment of the invention.
Figure 3B:
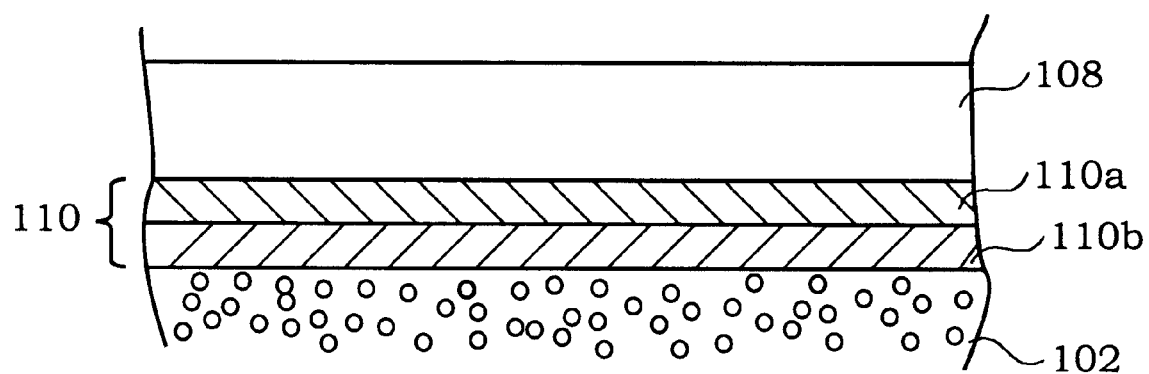
FIG. 3B shows a portion of a structure having a capping film composite stack in accordance with one embodiment of the invention.

In one embodiment, barrier 108 removal is accomplished using a dry etch process such as plasma etch. Capping film 110, discussed in greater detail below in reference to FIGS. 3A and 3B, is chosen to have a high selectivity to etch. Barrier 108 is then effectively removed by etch, with capping film 110 serving as an etch stop in addition to protecting the porous dielectric insulator 102. It should be appreciated that, in one embodiment, the 200 Å–300 Å thick barrier is rapidly and easily removed by etch with little by-product, and copper does not form volatile fluorides, thereby preventing copper etching or corrosion during barrier 108 etch.

Figure 2C:
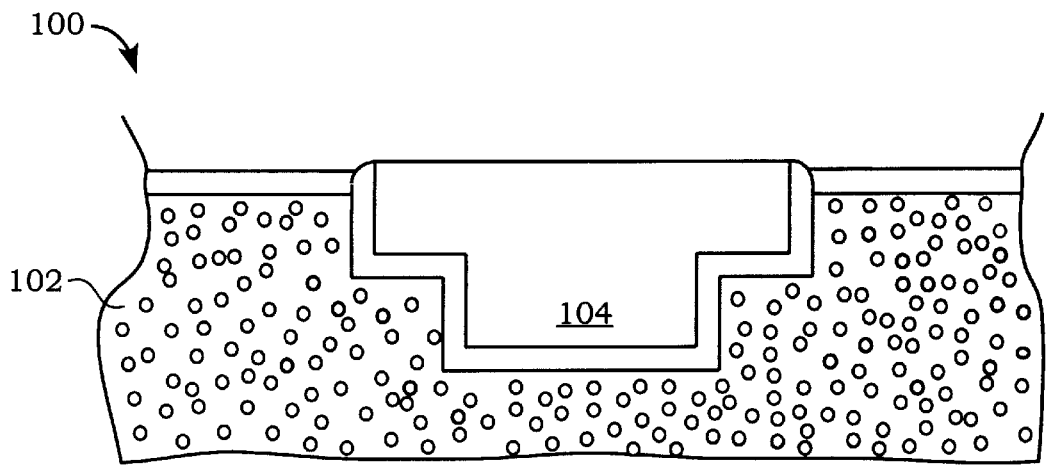
FIG. 2C illustrates the copper LowK dual damascene structure of FIGS. 2A and 2B at the completion of barrier etch in accordance with one embodiment of the invention.

FIG. 2C illustrates the copper LowK dual damascene structure 100 of FIGS. 2A and 2B at the completion of barrier 108 etch in accordance with one embodiment of the invention. Copper LowK dual damascene structure 100 includes a porous LowK dielectric insulator 102 in which features 104 are formed. Features 104 are lined with barrier liner 108', and copper filled 106'. Capping film 110 covers the surface of porous LowK dielectric insulator 102.

In one embodiment of the invention, additional copper LowK dual damascene structure 100 fabrication is performed. Capping film 110, which serves to protect porous LowK dielectric insulator 102 and provide an effective etch stop for barrier 108 etch, can also increase the effective K value of the composite porous LowK dielectric/capping film stack. In one embodiment of the present invention, a second etch is performed after barrier 108 etch to thin the capping film 110, and lower the effective K of the composite porous LowK dielectric/capping film stack.

FIG. 3A shows a closer view of a section of copper LowK dual damascene structure 100 shown in FIGS. 2A through 2C in accordance with one embodiment of the invention. In FIG. 3A, copper overburden 106 is shown over barrier 108, which is over capping film 110, which is over porous LowK dielectric insulator 102. As described in detail above in reference to FIGS. 2A through 2C, CMP is performed, in one embodiment of the invention, to remove copper overburden 106, and planarize surface at barrier 108. In one embodiment, plasma etch is next performed to remove barrier 108 at the surface of the structure, over the capping film 110. Plasma etch is performed to remove barrier 108, exposing capping film 110 at the surface of the structure. Capping film 110, in one embodiment, therefore serves as an etch stop for the plasma etch process. In one embodiment, capping film is highly selective to etch, is compatible with the materials used for barrier 108 such as Tantalum and Tantalum nitride, and has the lowest possible K value in order to maintain the lowest possible effective K for the composite stack of porous LowK dielectric/capping film.

Capping film 110, however, needs to be thick enough to provide the necessary protection for the underlying porous LowK dielectric insulator, and when the underlying dielectric is highly porous, capping film 110 will need to have greater thickness than for porous LowK dielectrics. In one embodiment, the thickness of capping film 110 ranges from about 5 Å to about 500 Å, and in one embodiment the thickness of capping film is about 50 Å. The thicker the capping film 110, however, the higher the effective K of the stack. In one embodiment of the present invention, a second etch process is performed to thin capping film 110. By thinning the capping film 110, the effective K-value of the stack can be lowered.

In one embodiment of the invention, a second etch is performed after the barrier etch. The second etch is performed to thin capping film 10, and is therefore performed in one embodiment as a timed etch process. In another embodiment, precision metrology is incorporated in-situ an etch chamber, and the capping film 110 etch is precisely monitored to remove a pre-determined thickness of capping film 110.

In one embodiment of the invention, capping film 110 is a single layer film having a thickness from about 5 Å to about 500 Å. In one embodiment, capping film is a composite stack of films having at least two contiguous but definable layers, and in another embodiment more than two contiguous but definable layers, in which the cumulative thickness of the capping film stack ranges from about 5 Å to about 500 Å. FIG. 3B shows a portion of a structure having a capping film composite stack 110 in accordance with one embodiment of the invention. The composite stack capping film 110 illustrated in FIG. 3B includes an upper layer 110a and a lower layer 110b. In another embodiment, capping film composite stack 10 includes more than two layers. In the illustrated example, upper layer 110a is of a material that is selective to barrier etch, and in one embodiment the barrier etch is an etch of Tantalum or Tantalum Nitride, in order to completely etch barrier 108, but upper layer 110a needs to also be compatible with barrier 108 so that a second etch will effectively thin or remove the upper layer 110a Additionally, upper layer 110a provides thickness to capping film composite stack 110 to protect the underlying porous LowK dielectric insulator 102 during earlier CMP and etch processes.

Lower layer 110b is the closest layer to porous LowK dielectric insulator 102 in the embodiment illustrated in FIG. 3B. Lower layer 110b maintains the lowest K-value in order for the resulting structure to maintain the lowest possible K-value. In one embodiment, lower layer 110 is an organic layer, and examples of materials used for lower layer 110b are Silicon Oxide, Silicon Nitride, Silicon Dioxide, Silicon Oxy-Nitride, Silicon Carbide, and the like. It should be appreciated that lower layer 110b is highly selective to etch in order for the thinning etch process, the second etch process, to effectively remove or thin the upper layer 110a, but leave the lower layer 110b intact.

Figure 2D:
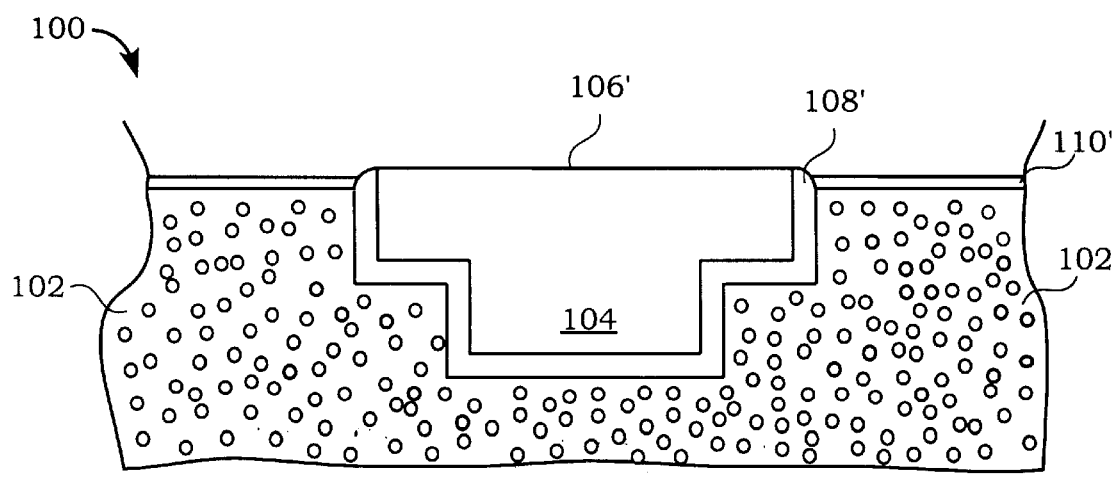
FIG. 2D shows the copper LowK dual damascene structure of FIGS. 2A through 2C at the completion of thinning etch of the capping film in accordance with one embodiment of the invention.

FIG. 2D shows the copper LowK dual damascene structure 100 of FIGS. 2A through 2C at the completion of thinning etch of capping film 110 (see FIGS. 2A–2C) in accordance with one embodiment of the invention. The resulting copper LowK dual damascene structure 100 includes a porous LowK dielectric insulator 102 in which features 104 are formed. Features 104 are lined with barrier liner 108', and are copper filled 106'. A thinned capping film 110' covers the surface of porous LowK dielectric insulator 102. The thinned capping film 110' is, in one embodiment, a single layer capping film that has been processed by a second etch operation to reduce the thickness of the initially formed capping film 110 (see FIGS. 2A–2C), and in another embodiment is a multi-layer capping film having at least two contiguous but definable layers formed in the initial capping film 110 (see FIGS. 3A–3B) and in which an uppermost layer 110a (see FIG. 3B) has been removed by etch, or in which uppermost layer 110a has been thinned.

Figure 4A:
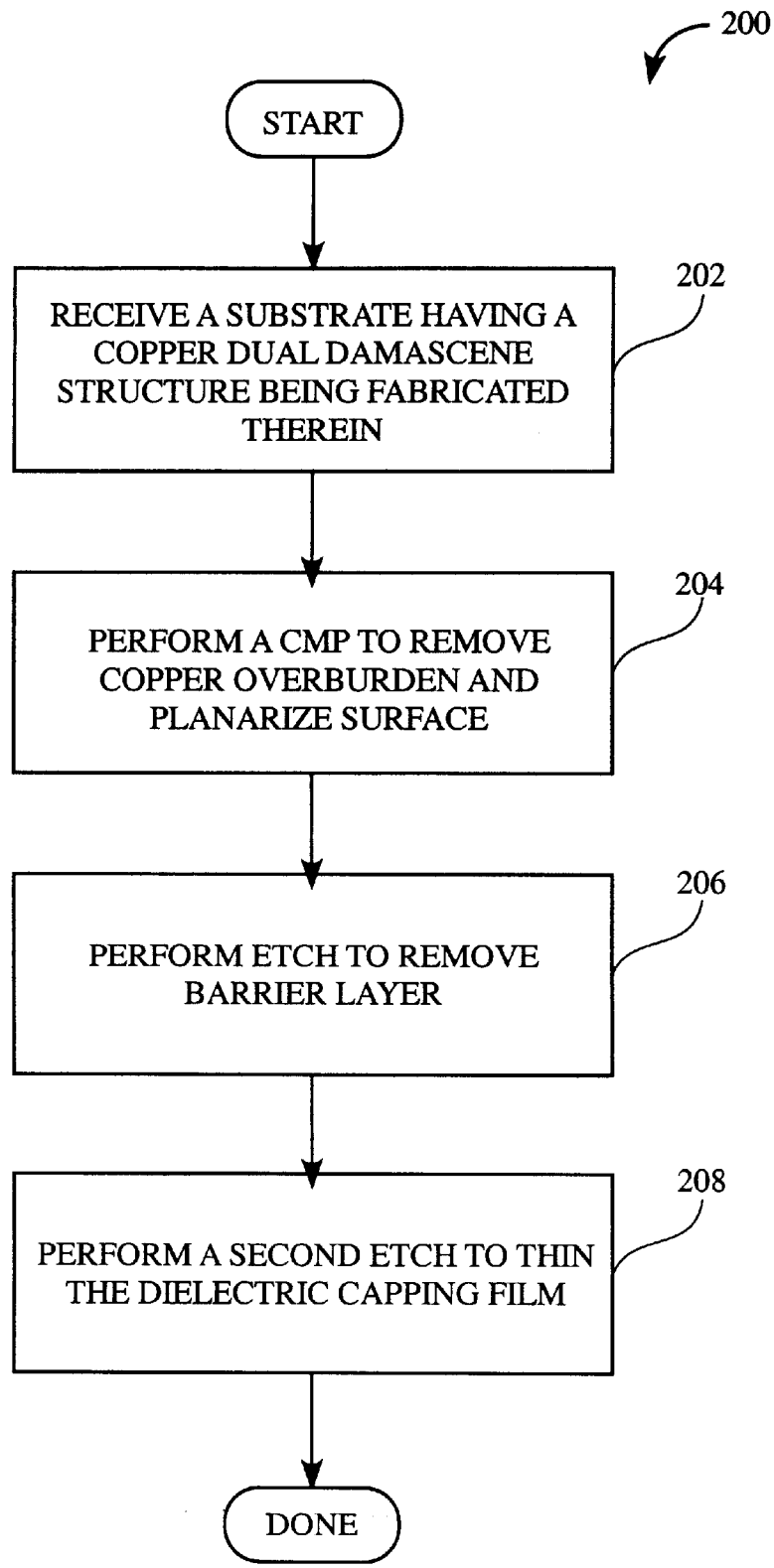
FIG. 4A is flow chart diagram illustrating the general overview of method operations performed in fabricating copper LowK dual damascene structures in accordance with one embodiment of the present invention.
Figure 4B:
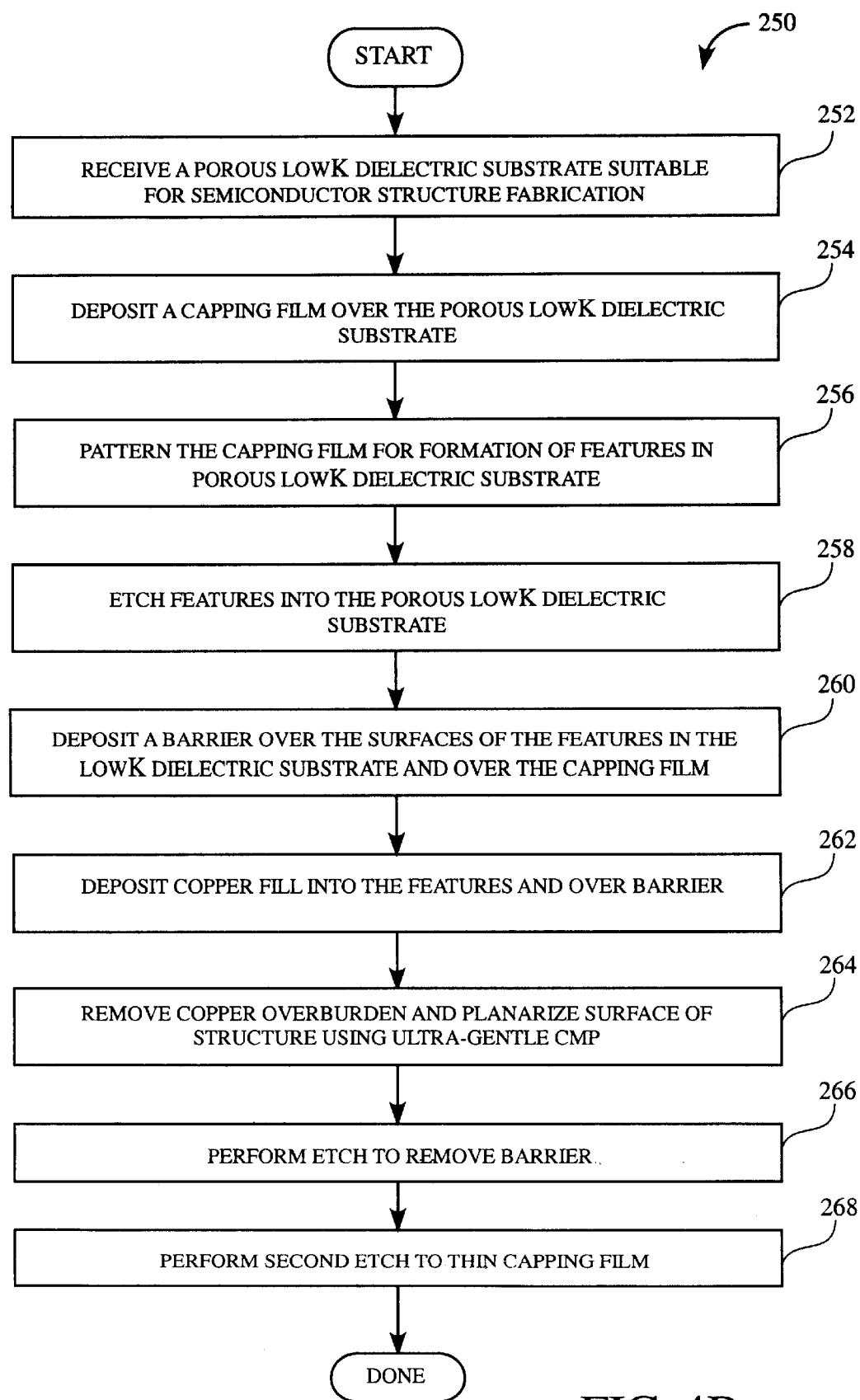
FIG. 4B shows flow chart diagram illustrating the method operations performed in the fabrication of a copper LowK dual damascene structures in accordance with one embodiment of the present invention.

By implementing a capping film and methods in accordance with embodiments of the present invention, copper LowK dual damascene structures can be fabricated to maintain the lowest possible effective K for the structure. As described above in reference to FIGS. 2A through 2D, and 3A through 3B, the process of fabricating a copper LowK dual damascene structure in embodiments of the present invention includes both CMP and etch processes, and additional etch thinning. FIGS. 4A and 4B are provided to outline the method operations of fabrication in accordance with an embodiment of the invention.

FIG. 4A is flow chart diagram 200 illustrating the general overview of method operations performed in fabricating copper LowK dual damascene structures in accordance with one embodiment of the present invention. The method begins with operation 202 in which a insulator having a copper dual damascene structure being fabricated therein is received. In one embodiment, the insulator received is the structure illustrated in FIG. 2A. A insulator which, in one embodiment is a porous LowK dielectric insulator, is fabricated with features that are lined with a barrier. A capping film has been formed over the insulator surface, and the barrier layer is over the capping film on the surface of the insulator. Copper fill has been deposited into the features and copper overburden covers the barrier.

The method continues with operation 204 in which a CMP operation is performed to remove the copper overburden and planarize the surface. In one embodiment, at the completion of operation 204, the insulator appears as illustrated in FIG. 2B. The copper overburden has been removed by CMP and the planarized surface includes the barrier and the copper filling the features.

The method next performs operation 206 in which an etch process is performed to remove the barrier. The capping film, which in one embodiment is highly selective to etch, remains on the surface of the insulator as illustrated in FIG. 2C along with the edge of the barrier remaining on the walls of the features and the copper fill in the features.

The method concludes with operation 208 in which a second etch is performed to thin the dielectric capping film. In one embodiment, the capping film is processed by a brief, timed etch in order to thin the capping film and lower the effective K-value of the composite porous dielectric/capping film stack. After the thinning is completed, the method is done. In one embodiment, the fabricated structure appears as illustrated in FIG. 2D.

FIG. 4B shows flow chart diagram 250 illustrating the method operations performed in the fabrication of a copper LowK dual damascene structures in accordance with one embodiment of the present invention. FIG. 4B represents more detail than the general overview presented in FIG. 4A.

The method begins with operation 252 in which a porous LowK dielectric suitable for semiconductor fabrication is received. In one embodiment, the porous LowK dielectric insulator is a highly porous dielectric insulator.

The method continues with operation 254 in which a capping film is deposited or otherwise formed over the porous LowK dielectric insulator. In one embodiment, the capping film is highly selective to etch of Tantalum and Tantalum Nitride which are commonly used for barrier formation. In one embodiment, the capping film is deposited or otherwise formed to a thickness of 5 Å–500 Å, and in one embodiment, the thickness of capping film is about 50 Å.

The method continues with operation 256 in which the porous LowK dielectric insulator having capping film is patterned for the formation of features. In accordance with known photolithography techniques, feature patterns are patterned into the capping film, which covers the porous LowK dielectric structure. The method then proceeds with operation 258 in which the features are etched through the capping film and into the porous LowK dielectric insulator. Such features include trenches and vias, and feature fabrication processes include trench-first fabrication as well as via-first fabrication.

The method next completes operation 260 in which a barrier is deposited or otherwise formed over the surfaces of the features and covering the capping film on the surface of the porous LowK dielectric structure. Surfaces of the features include the walls and floors of the features within the porous LowK dielectric insulator. In one embodiment, the barrier is a Tantalum barrier. In another embodiment, the barrier is a Tantalum Nitride barrier. In additional embodiments, the barrier is any material providing sufficient liner properties between the copper, or other conductive material, and the porous LowK dielectric structure, and sufficient polish stop properties to delineate the end of the CMP of the copper overburden.

Next, the method performs operation 262 in which the copper is deposited into the features, filling the features and resulting in copper overburden over the barrier and capping film over the surface of the insulator. In one embodiment, copper is used as the conductive material in the LowK dual damascene structure. In other embodiments, conductive materials such as Tungsten, Aluminum, and the like are used. In one embodiment, the structure at the completion of operation 262 appears as the structure illustrated in FIG. 2A.

The method proceeds with operation 264 in which the copper overburden is removed by ultra-gentle CMP, and the surface planarized with the barrier exposed, and the surface essentially including the copper fill in the features and the barrier. Ultra-gentle CMP is, in one embodiment, as described above and includes a hard skin processing surface over a flexible and compliant processing tool or core, applied to the surface of the structure being fabricated with, in one embodiment, an abrasive-less slurry.

In one embodiment, copper is removed and planarized by using inhibitor-assisted direct charge transfer chemistry. In one embodiment, once the copper overburden has been removed and the surface planarized in operation 264, the structure appears as illustrated in FIG. 2B.

The method continues with operation 266 in which the barrier is removed by an etch process. In one embodiment, the capping film is highly selective to etch, and the barrier is approximately 200 Å–300 Å in thickness. Etching is therefore a rapid process with little by-product. In one embodiment, at the completion of operation 266, the structure appears as illustrated in FIG. 2C.

The method concludes with operation 268 in which a second etch process is performed to thin the capping film. In one embodiment, the capping film is a multi-layer film having at least two layers. In such an embodiment, the uppermost layer is essentially removed by etching, and the effective K of the remaining composite LowK dielectric/capping film stack is lowered. In another embodiment, the capping film is a single layer film, and the thinning etch process is a timed etch to remove a portion of the capping film and thereby lower the effective K of the composite LowK dielectric/capping film stack. Once the capping film has been thinned in operation 268, the method is done. In one embodiment of the invention, the resulting copper LowK dual damascene structure is as illustrated in FIG. 2D.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for fabricating semiconductor structures on an insulator, comprising:

forming a LowK dielectric material over the insulator;

forming a capping film over the LowK dielectric material;

forming features in the LowK dielectric material, the features having inner defined by the LowK dielectric material, the features defining regions for receiving conductive material;

forming a barrier layer over the capping film and over the surfaces of the features;

filling the features with the conductive material, the filling leaving an overburden amount of the conductive material;

performing a chemical mechanical planarization (CMP) operation to remove the overburden amount of the conductive material, the CMP operation configured to be discontinued upon reaching at least part of the barrier layer; and performing a dry etch to remove the barrier layer, the dry etch being configured to expose at least part of the capping film, wherein the CMP operation is an ultra-gentle CMP operation in which an abrasive-less slurry is utilized and further in which an inhibitor assisted direct charge transfer chemistry is utilized.

2. The method for fabricating semiconductor structures on an insulator as recited in claim 1, wherein the conductive material is copper.

3. The method for fabricating semiconductor structures on an insulator as recited in claim 1, wherein the barrier layer is one of Tantalum and Tantalum Nitride.

4. The method for fabricating semiconductor structures on an insulator as recited in claim 1, wherein the LowK dielectric material is one of a porous LowK dielectric material and a highly porous LowK dielectric material.

5. The method for fabricating semiconductor structures on an insulator as recited in claim 1, wherein the features include trench features and via features.

6. The method for fabricating semiconductor structures on an insulator as recited in claim 1, further comprising performing a second dry etch to thin the capping film, the thinning configured to decrease the thickness of the capping film without removing the capping film.

7. The method for fabricating semiconductor structures on an insulator as recited in claim 6, wherein the capping film has a thickness of between about 5 Å and about 500 Å.

8. A method for fabricating semiconductor structures on an insulator, comprising:

forming a LowK dielectric material over the insulator;

forming a capping film over the LowK dielectric material, the capping film being defined by at least two contiguously formed material layers;

forming features in the LowK dielectric material, the features having inner surfaces defined by the LowK dielectric material, the features defining regions for receiving a conductive material;

forming a barrier layer over the capping film and over the surfaces of the features;

filling the features with the conductive material, the filling leaving an overburden amount of the conductive material;

performing a chemical mechanical planarization (CMP) operation to remove the overburden amount of the conductive material, the CMP operation configured to be discontinued upon reaching at least part of the barrier layer;

performing a first dry etch to remove the barrier layer, the first dry etch being configured to expose at least part of the capping film; and performing a second dry etch to remove at least one of the contiguously formed material layers of the capping film.

9. The method for fabricating semiconductor structures on an insulator as recited in claim 8, wherein the LowK dielectric material is one of porous LowK dielectric material and highly porous LowK dielectric material.

10. The method for fabricating semiconductor structures on an insulator as recited in claim 8, wherein the capping film being defined by at least two contiguously formed material layers has a thickness between about 5 Å and about 500 Å.

11. The method for fabricating semiconductor structures on an insulator as recited in claim 8, wherein the capping film being defined by at least two contiguously formed material layers has a thickness of about 50 Å.

12. The method for fabricating semiconductor structures on an insulator as recited in claim 8, wherein the conductive material is copper.

13. The method for fabricating semiconductor structures on an insulator as recited in claim 8, wherein the CMP operation is an ultra-gentle CMP operation in which an abrasive-less slurry is utilized, and further in which an inhibitor assisted direct charge transfer chemistry is utilized.

14. In a semiconductor structure having a LowK dielectric material, the LowK dielectric material having features defined therein for forming conductive vias and conductive vias and trenches, a top surface of the LowK dielectric material having a capping film, and a barrier film lining the features and formed over the capping film, and a conductive material filling the features and leaving a portion of overburden conductive material over the barrier film, a method for removing the portion of overburden conductive material, the barrier film and the capping film, comprising:

(a) performing a chemical mechanical planarization (CMP) operation to remove the portion of overburden conductive material;

(b) discontinuing the CMP operation when the portion of overburden conductive material is determined to be substantially removed;

(c) moving the semiconductor structure to a plasma etching station;

(d) performing an initial plasma etch to remove the barrier film;

(e) performing a follow-up plasma etch to remove at least part of the capping film; and (f) determining if a next LowK dielectric layer is required; and if the next LowK dielectric layer is required,
  forming the next LowK dielectric layer and repeating (a)–(f).

15. The method according to claim 14, wherein the CMP operation is an ultra-gentle CMP operation in which an abrasive-less slurry is utilized, and further in which an inhibitor assisted direct charge transfer chemistry is utilized.

16. The method according to claim 14, wherein the capping film being defined by at least two contiguously formed material layers has a thickness between about 5 Å and about 500 Å.

17. The method according to claim 14, wherein the capping film has a thickness between about 5 Å and about 500 Å.

18. The method according to claim 17, wherein the capping film is defined by a single layer of material.

19. The method according to claim 17, wherein the capping film is defined by a plurality of layers having at least two contiguously formed material layers.

* * * * *